United States Patent
Jeon

(10) Patent No.: US 11,810,868 B2
(45) Date of Patent: Nov. 7, 2023

(54) SEMICONDUCTOR PACKAGE

(71) Applicant: Samsung Electronics Co., Ltd., Suwon-si (KR)

(72) Inventor: Byeonguk Jeon, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/209,587

(22) Filed: Mar. 23, 2021

(65) Prior Publication Data
US 2021/0407929 A1 Dec. 30, 2021

(30) Foreign Application Priority Data
Jun. 29, 2020 (KR) .......................... 10-2020-0079478

(51) Int. Cl.
*H01L 23/00* (2006.01)
*H01L 25/065* (2023.01)
*H01L 25/00* (2006.01)

(52) U.S. Cl.
CPC ........ *H01L 23/562* (2013.01); *H01L 25/0652* (2013.01); *H01L 25/0657* (2013.01); *H01L 25/50* (2013.01); *H01L 2225/0651* (2013.01); *H01L 2225/06517* (2013.01); *H01L 2225/06555* (2013.01); *H01L 2225/06575* (2013.01); *H01L 2225/06586* (2013.01)

(58) Field of Classification Search
CPC .................................................. H01L 25/0652
See application file for complete search history.

(56) References Cited

U.S. PATENT DOCUMENTS

| | | | |
|---|---|---|---|
| 8,741,683 B2 | 6/2014 | Huang et al. | |
| 8,995,129 B2 | 3/2015 | Iwata et al. | |
| 9,024,437 B2 | 5/2015 | Yen et al. | |
| 9,136,241 B2 | 9/2015 | Yen et al. | |
| 10,453,763 B2 | 10/2019 | Barber et al. | |
| 2005/0161791 A1 | 7/2005 | Hortaleza | |
| 2008/0131999 A1 | 6/2008 | Takiar et al. | |
| 2015/0333038 A1* | 11/2015 | Hatakeyama | H01L 25/065 257/777 |
| 2019/0148349 A1* | 5/2019 | Kim | H01L 23/5384 257/738 |
| 2019/0259742 A1* | 8/2019 | Han | H01L 24/49 |
| 2019/0341332 A1 | 11/2019 | Lin et al. | |
| 2021/0082895 A1* | 3/2021 | Miura | H01L 24/81 |

* cited by examiner

Primary Examiner — Yu-Hsi D Sun
(74) Attorney, Agent, or Firm — Myers Bigel, P.A.

(57) ABSTRACT

A packaged integrated circuit device includes a substrate having a surface thereon. A spacer and a first semiconductor chip are provided at spaced-apart locations on a first portion of the surface of the substrate. This first portion of the surface of the substrate has a lateral area equivalent to a sum of: (i) a lateral footprint of the spacer, (ii) a lateral footprint of the first semiconductor chip, and (iii) an area of an entire lateral space between the spacer and the first semiconductor chip. A stack of second semiconductor chips is provided, which extends on the spacer and on the first semiconductor chip. The stack of second semiconductor chips has a lateral footprint greater than the lateral area of the first portion of the surface of the substrate so that at least a portion of the stack of second semiconductor chips overhangs at least one sidewall of at least one of the spacer and the first semiconductor chip, which extend between the stack of second semiconductor chips and the surface of the substrate.

13 Claims, 13 Drawing Sheets

SEMICONDUCTOR PACKAGE

REFERENCE TO PRIORITY APPLICATION

This U.S. non-provisional patent application claims priority under 35 U.S.C. § 119 to Korean Patent Application No. 10-2020-0079478, filed Jun. 29, 2020, the entire contents of which are hereby incorporated herein by reference.

BACKGROUND

The present disclosure relates to semiconductor packages and, in particular, to semiconductor packages having stacked semiconductor chips therein.

A semiconductor package is configured to allow a semiconductor chip to be easily used as a part of an electronic product. In general, the semiconductor package includes a printed circuit board (PCB) (or similar substrate) and a semiconductor chip, which is mounted on the PCB and is electrically connected to the PCB by bonding wires or bumps. With recent developments of the electronics industry, a semiconductor package technology is developing in various ways with the goal of miniaturization, weight reduction, and manufacturing cost reduction. In addition, as the use of this technology expands to fields such as mass storage devices, various types of semiconductor packages are emerging.

SUMMARY

An embodiment of the inventive concept provides a semiconductor device with improved stability.

According to an embodiment of the inventive concept, a semiconductor package may include a substrate having a first side surface and a second side surface, which are opposite to each other, a spacer on the substrate, a first semiconductor chip disposed on the substrate to be horizontally spaced apart from the spacer, and a plurality of second semiconductor chips stacked on the spacer and the first semiconductor chip. The spacer may have an outer side surface, which is adjacent to the first side surface of the substrate, and an inner side surface, which is opposite to the outer side surface. The lowermost second semiconductor chip of the second semiconductor chips may have a third side surface, which is adjacent to the first side surface of the substrate, and a fourth side surface, which is opposite to the third side surface. The outer side surface of the spacer may be farther from the first side surface of the substrate than the third side surface of the lowermost second semiconductor chip in a first direction parallel to a top surface of the substrate, and the inner side surface of the spacer may be farther from the second side surface of the substrate than the fourth side surface of the lowermost second semiconductor chip in a direction antiparallel to the first direction.

According to an embodiment of the inventive concept, a semiconductor package may include a substrate having a first side surface and a second side surface, which are opposite to each other, a first spacer on the substrate, a first lower chip disposed on the substrate to be horizontally spaced apart from the first spacer, a second lower chip disposed on the substrate to be spaced apart from the first spacer with the first lower chip interposed therebetween, a plurality of first semiconductor chips on the first spacer, and a plurality of second semiconductor chips stacked on the first lower chip and the second lower chip. Each of the first spacer and the lowermost first semiconductor chip of the first semiconductor chips may have an outer side surface, which is adjacent to the first side surface of the substrate. Each of the second lower chip and the lowermost second semiconductor chip of the second semiconductor chips may have an outer side surface, which is adjacent to the second side surface of the substrate. The outer side surface of the first spacer may be farther from the first side surface of the substrate than the outer side surface of the lowermost first semiconductor chip in a first direction parallel to a top surface of the substrate. The outer side surface of the second lower chip may be farther from the second side surface of the substrate than the outer side surface of the lowermost second semiconductor chip in a direction antiparallel to the first direction.

According to another embodiment of the inventive concept, a semiconductor package may include a substrate, a spacer on the substrate, a lower chip disposed on the substrate and spaced apart from the spacer in a first direction parallel to the substrate, a plurality of first semiconductor chips on the spacer, a plurality of second semiconductor chips on the lower chip, and a plurality of third semiconductor chips stacked on the first semiconductor chips and the second semiconductor chips. When viewed in a plan view, a width of the spacer in the first direction may be smaller than a width of the lowermost first semiconductor chip of the first semiconductor chips in the first direction, and a width of the lower chip in the first direction may be smaller than a width of the lowermost second semiconductor chip of the second semiconductor chips in the first direction.

According to still further embodiments of the invention, a packaged integrated circuit device includes a substrate having a surface thereon, a spacer, and a first semiconductor chip at spaced-apart locations on a first portion of the surface of the substrate. The first portion of the surface of the substrate has a lateral area equivalent to a sum of: (i) a lateral footprint of the spacer, (ii) a lateral footprint of the first semiconductor chip, and (iii) an area of an entire lateral space between the spacer and the first semiconductor chip. A stack of second semiconductor chips is provided, which extends on the spacer and on the first semiconductor chip. The stack of second semiconductor chips has a lateral footprint greater than the lateral area of the first portion of the surface of the substrate so that at least a portion of the stack of second semiconductor chips overhangs at least one sidewall of at least one of the spacer and the first semiconductor chip, which extend between the stack of second semiconductor chips and the surface of the substrate.

In some of these embodiments, an overhang between the portion of the stack of second semiconductor chips and the at least one sidewall is in a range from 10 um to 500 um. In other embodiments, the spacer is a rectangular-shaped spacer having a first thickness, as measured in a direction normal to the surface of the substrate, a first width (W1), as measured in a first direction that is parallel to the surface of the substrate, and a first length (L1), as measured in a second direction that is parallel to the surface of the substrate and orthogonal to the first direction. In addition, the first semiconductor chip is a rectangular-shaped chip having a second thickness, as measured in the direction normal to the surface of the substrate, a second width (W2), as measured in the first direction parallel to the surface of the substrate, and a second length (L2), as measured in the second direction parallel to the surface of the substrate. In addition, a first one of the stack of second semiconductor chips closest to the surface of the substrate has a third width (W3), as measured in the first direction parallel to the surface of the substrate, and a third length (L3), as measured in the second direction parallel to the surface of the substrate. Advantageously, L1<L3, L2<L3, (W1+W2)<W3, and 0.8 (L3)≤L1≤0.99 (L3).

In addition, a first adhesive layer is provided, which adheres the spacer to the surface of the substrate, a second adhesive layer is provided, which adheres the first semiconductor chip to the surface of the substrate, and a third adhesive layer is provided, which adheres a first one of the stack of second semiconductor chips to at least one of the spacer and the first semiconductor chip. A mold layer is also provided on the substrate, which covers the spacer, the first semiconductor chip and the stack of second semiconductor chips. Bonding wires are provided, which electrically couple portions of each of the first semiconductor chip and the stack of second semiconductor chips to the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Example embodiments of the inventive concepts will now be described more fully with reference to the accompanying drawings, in which example embodiments are shown.

Figure 1A:
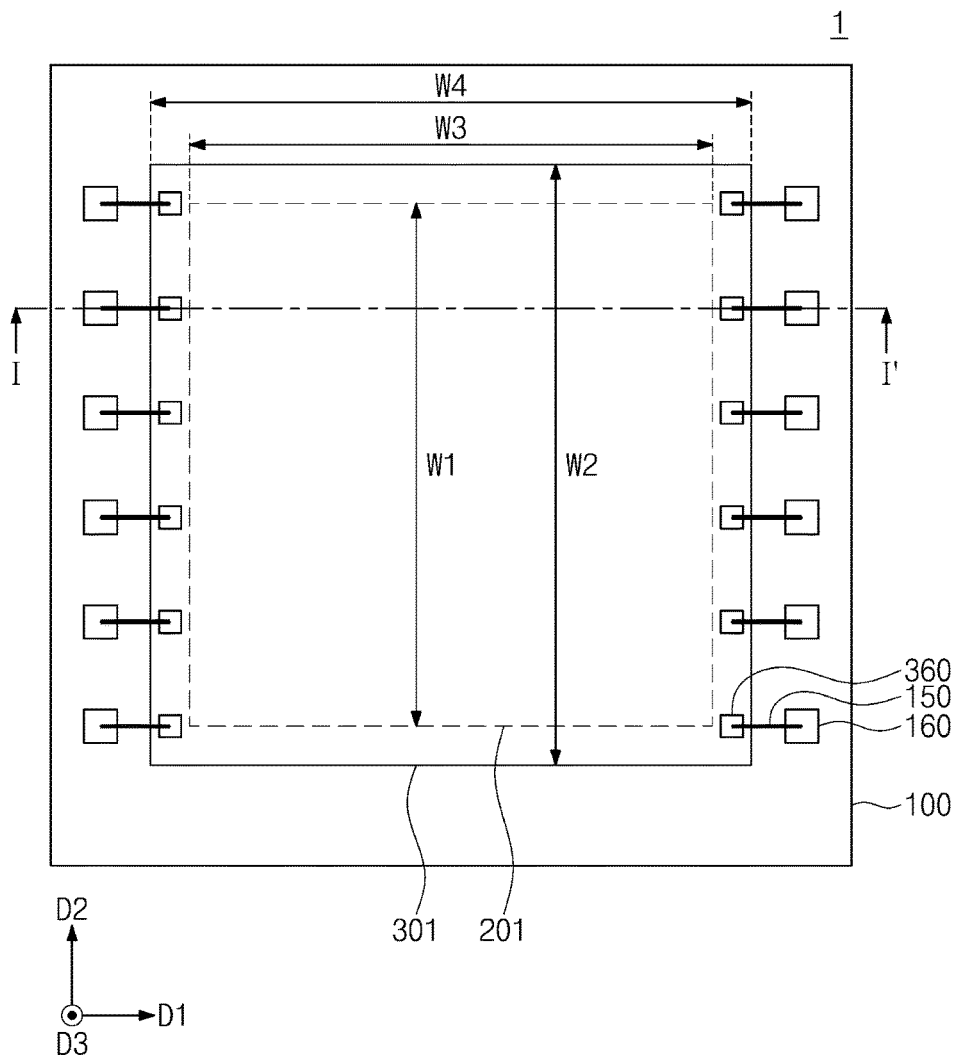
FIG. 1A is a plan view illustrating a semiconductor package according to an embodiment of the inventive concept.
Figure 1B:
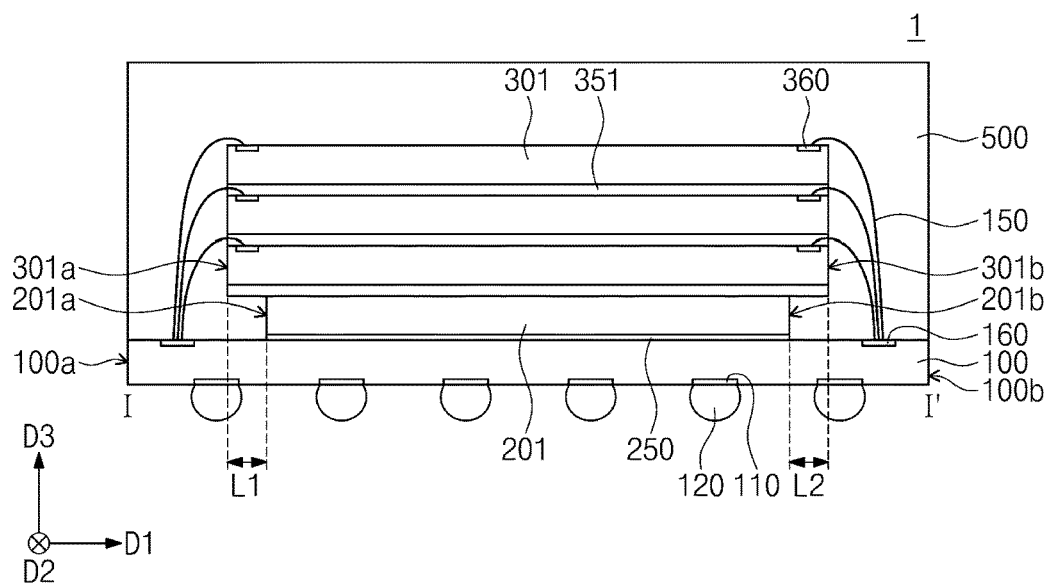
FIG. 1B is a section taken along a line I-I' of FIG. 1A.

FIG. 1A is a plan view illustrating a semiconductor package according to an embodiment of the inventive concept. FIG. 1B is a section taken along a line I-I' of FIG. 1A. Referring to FIGS. 1A and 1B, a semiconductor package 1 may include a substrate 100, a spacer 201, a plurality of first semiconductor chips 301, and a mold layer 500. In some embodiments, the substrate 100 may be a printed circuit board (PCB), and may include a first side surface 100a and a second side surface 100b, which are opposite to each other. Outer terminals 120 may be provided on a bottom surface of the substrate 100. In particular, the outer terminals 120 may be disposed on bottom surfaces of terminal pads 110 disposed on the bottom surface of the substrate 100. The outer terminal 120 may include a solder ball or a solder bump, however, other terminals may also be used. The outer terminal 120 may be formed of, or include, a conductive metal material and, for example, may include at least one of metals (e.g., tin (Sn), lead (Pb), nickel (Ni), gold (Au), silver (Ag), copper (Cu), aluminum (Al), and bismuth (Bi)). Substrate pads 160 may be provided on a top surface of the substrate 100. The terminal pad 110 and the substrate pad 160 may be formed of, or include, a conductive metal material and, for example, may include at least one of metals (e.g., tin (Sn), lead (Pb), nickel (Ni), gold (Au), silver (Ag), copper (Cu), aluminum (Al), and bismuth (Bi)). The outer terminals 120 may be electrically connected to the substrate pads 160 through internal lines (not shown) in the substrate 100. The outer terminals 120 may be coupled to an external device. Thus, the substrate pads 160 may exchange external signals with an external device through the outer terminals 120.

The spacer 201 may be disposed on the substrate 100. The spacer 201 may support semiconductor chips, which are placed on the spacer 201. The spacer 201 may include a first side surface 201a, which is adjacent to the first side surface 100a of the substrate 100, and a second side surface 201b, which is opposite to the first side surface 201a. The spacer 201 may be formed of, or include, at least one insulating material. For example, the spacer 201 may be formed of, or include, a silicon-containing insulating material. As an example, the spacer 201 may be formed of, or include, silicon oxide (SiO) or silicon nitride (SiN). A spacer adhesive layer 250 may be interposed between the spacer 201 and the substrate 100. The spacer adhesive layer 250 may be formed of, or include, an insulating polymer.

The first semiconductor chips 301 may be disposed on the spacer 201. The first semiconductor chips 301 may be stacked in a vertical direction (i.e., in a third direction D3 perpendicular to a top surface of the substrate 100). The first semiconductor chip 301 may be a memory chip. The first semiconductor chips 301 may include a first side surface 301a, which is adjacent to the first side surface 100a of the substrate 100, and a second side surface 301b, which is opposite to the first side surface 301a.

First semiconductor chip adhesive layers 351 may be respectively interposed between the first semiconductor chips 301 and between the lowermost one of the first semiconductor chips 301 and the spacer 201. The first semiconductor chip adhesive layer 351 may be formed of, or include, an electrically insulating polymer.

Chip pads 360 may be provided on a top surface of each of the first semiconductor chips 301. The chip pad 360 may be formed of, or include, a conductive metal material and, for example, may include at least one of metals (e.g., tin (Sn), lead (Pb), nickel (Ni), gold (Au), silver (Ag), copper (Cu), aluminum (Al), and bismuth (Bi)). The chip pads 360 and the substrate pads 160 may be electrically connected to each other through connecting portions 150. Thus, the first semiconductor chips 301 may be electrically connected to the substrate 100. For example, the connecting portion 150 may be bonding wires.

The mold layer 500 may be provided on the substrate 100 to cover the spacer 201 and the first semiconductor chips 301. The mold layer 500 may include an insulating polymer (e.g., epoxy molding compound).

Hereinafter, the first semiconductor chip 301 may be defined as the lowermost one of the first semiconductor chips 301. In addition, the first side surface 201a of the spacer 201 may be farther from the first side surface 100a of the substrate 100 than the first side surface 301a of the first semiconductor chip 301 in a direction parallel to the top surface of the substrate 100 (e.g., in a first direction D1). The second side surface 201b of the spacer 201 may be farther from the second side surface 100b of the substrate 100 than the second side surface 301b of the first semiconductor chip 301 in the direction parallel to the top surface of the substrate 100 (e.g., in a direction antiparallel to the first direction D1). A distance L1 between the first side surface 201a of the spacer 201 and the first side surface 301a of the first semiconductor chip 301 in the first direction D1 may range from 10 µm to 500 µm or from 30 µm to 250 µm. A distance L2 between the second side surface 201b of the spacer 201 and the second side surface 301b of the first semiconductor chip 301 in the first direction D1 may range from 10 µm to 500 µm or from 30 µm to 250 µm.

When viewed in a plan view, an area of the spacer 201 may be smaller than an area of the first semiconductor chip 301. A width W1 of the spacer 201 may be smaller than a width W2 of the first semiconductor chip 301, when measured in a second direction D2 that is parallel to the top surface of the substrate 100 and is perpendicular to the first direction D1. For example, the width W1 of the spacer 201 in the second direction D2 may be 80 to 99% of the width W2 of the first semiconductor chip 301 in the second direction D2. A width W3 of the spacer 201 in the first direction D1 may be smaller than a width W4 of the first semiconductor chip 301 in the first direction D1. For example, the width W3 of the spacer 201 in the first direction D1 may be 80 to 99% of the width W4 of the first semiconductor chip 301 in the first direction D1.

In general, a relatively strong stress may be exerted on a portion of a substrate, which is in contact with a side surface of a spacer or a semiconductor chip thereon. According to an embodiment of the inventive concept, since the side surfaces of the spacer 201 are located at more interior positions than the side surfaces of the first semiconductor chip 301 on the spacer 201, it may be possible to reduce a stress exerted on the portion of the substrate 100 which is in contact with the side surface of the spacer 201. In detail, according to an embodiment of the inventive concept, a stress of 100 MPa (mega Pascal) or less may be exerted on the portion of the substrate 100 which is in contact with the side surface of the spacer 201. By contrast, in the case where the side surfaces of the spacer are aligned to the side surfaces of the semiconductor chip in the second direction D2, a stress, which is exerted on the portion of the substrate which is in contact with the side surface of the spacer, may have a value of 105 MPa or higher. Thus, according to an embodiment of the inventive concept, it may be possible to reduce the stress by at least 10-20%, compared to the conventional case in which the side surfaces of the spacer are aligned to the side surfaces of the semiconductor chip. Since the stress exerted on the substrate is reduced, it may be possible to prevent or suppress a crack issue from occurring in internal interconnection lines in the substrate.

Figure 2A:
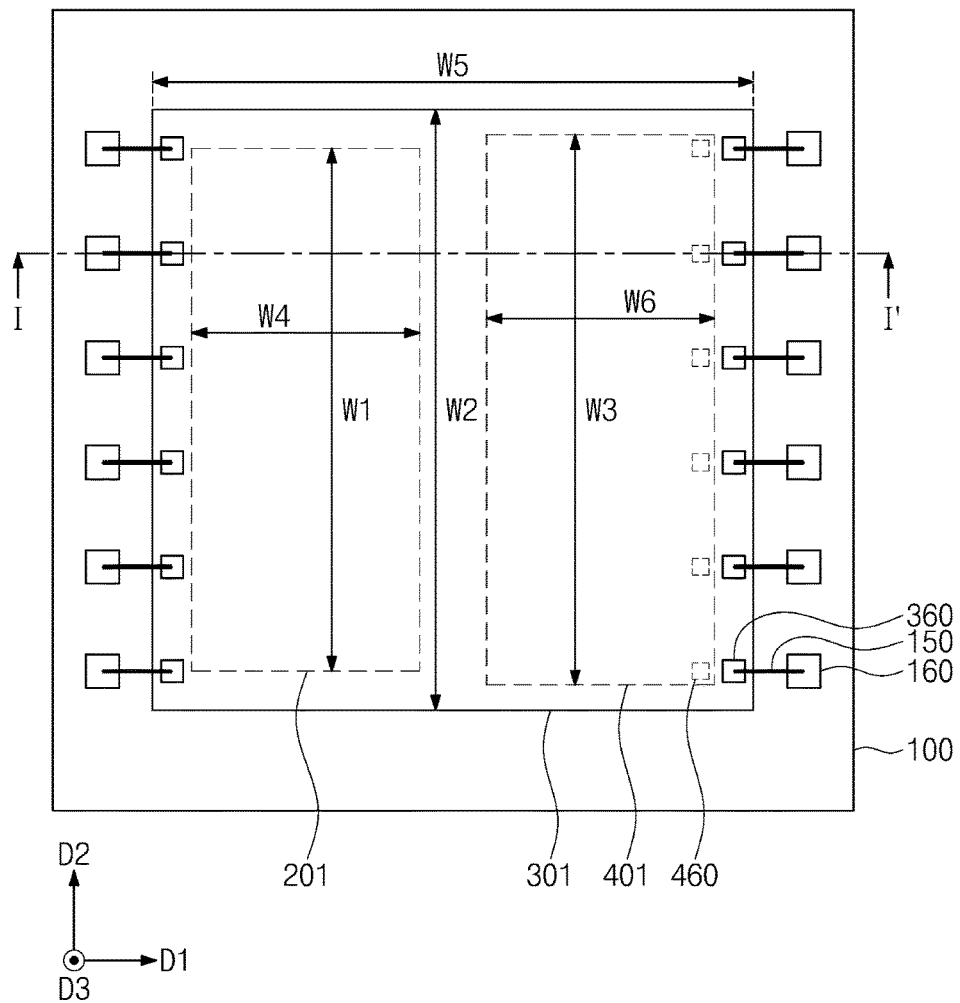
FIG. 2A is a plan view illustrating a semiconductor package according to an embodiment of the inventive concept.
Figure 2B:
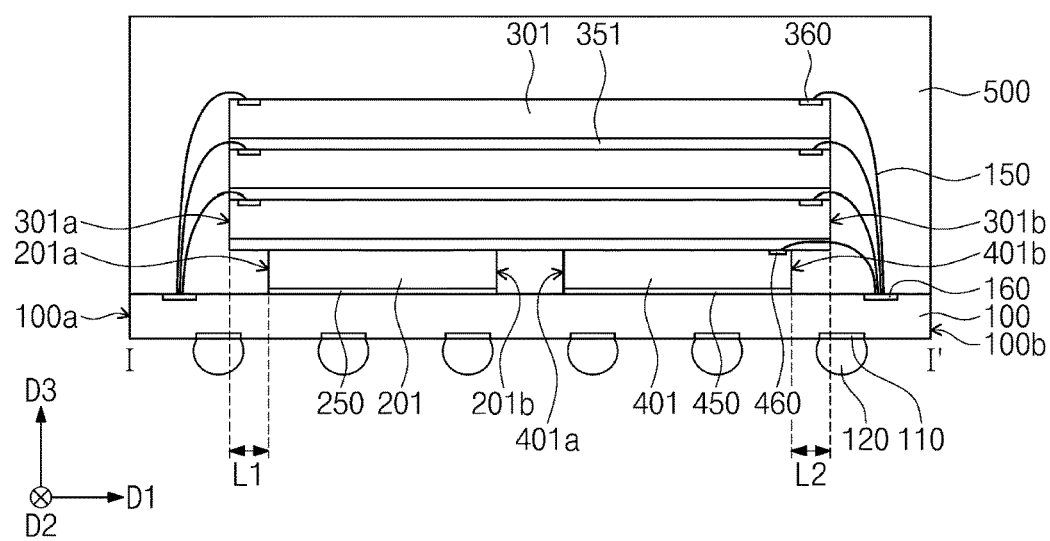
FIG. 2B is a section taken along a line I-I' of FIG. 2A.

FIG. 2A is a plan view illustrating a semiconductor package according to an embodiment of the inventive concept. FIG. 2B is a section taken along a line I-I' of FIG. 2A. For concise description, a previously described element may be identified by the same reference number without repeating an overlapping description thereof.

Referring to FIGS. 2A and 2B, the semiconductor package 1 may include the substrate 100, the spacer 201, a lower semiconductor chip 401, the first semiconductor chips 301, and the mold layer 500. The spacer 201 and the lower semiconductor chip 401 may be provided on the substrate 100. The spacer 201 and the lower semiconductor chip 401 may be horizontally spaced apart from each other. The first semiconductor chips 301 may be stacked on the spacer 201 and the lower semiconductor chip 401 in a vertical direction (e.g., the third direction D3). The lower semiconductor chip 401 may be a logic chip (e.g., a controller), which is used to control the first semiconductor chips 301. The lower semiconductor chip 401 may include a first side surface 401a, which is adjacent to the first side surface 100a of the substrate 100, and a second side surface 401b, which is opposite to the first side surface 401a. A lower semiconductor chip adhesive layer 450 may be interposed between the lower semiconductor chip 401 and the substrate 100. The lower semiconductor chip adhesive layer 450 may be formed of, or include, an insulating polymer.

Lower semiconductor chip pads 460 may be provided on a top surface of the lower semiconductor chip 401. The lower semiconductor chip pad 460 may be formed of, or include, a conductive metal material and, for example, may include at least one of metals (e.g., tin (Sn), lead (Pb), nickel (Ni), gold (Au), silver (Ag), copper (Cu), aluminum (Al), and bismuth (Bi)). The lower semiconductor chip pads 460 may be electrically connected to the substrate pads 160 through the connecting portions 150. Thus, the lower semiconductor chip 401 may be electrically connected to the substrate 100. And, the mold layer 500 may be provided on the substrate 100 to cover the spacer 201, the first semiconductor chips 301, and the lower semiconductor chip 401.

Hereinafter, the first semiconductor chip 301 may be defined as the lowermost one of the first semiconductor chips 301.

The first side surface 201a of the spacer 201 may be farther from the first side surface 100a of the substrate 100 than the first side surface 301a of the first semiconductor chip 301 in the direction parallel to the top surface of the substrate 100 (e.g., in the first direction D1). The second side surface 201b of the spacer 201 may be farther from the second side surface 100b of the substrate 100 than the second side surface 301b of the first semiconductor chip 301 in the direction parallel to the top surface of the substrate 100 (e.g., in the direction antiparallel to the first direction D1). The distance L1 between the first side surface 201a of the spacer 201 and the first side surface 301a of the first semiconductor chip 301 in the first direction D1 may range from 10 µm to 500 µm or from 30 µm to 250 µm.

When viewed in a plan view, the area of the spacer 201 may be smaller than the area of the first semiconductor chip 301. When viewed in a plan view, the width W1 of the spacer 201 in the second direction D2 may be smaller than the width W2 of the first semiconductor chip 301 in the second direction D2. For example, the width W1 of the spacer 201 in the second direction D2 may be 80 to 99% of the width W2 of the first semiconductor chip 301 in the second direction D2. The width W4 (of the spacer 201 in the first direction D1 may be smaller than a width W5 of the first semiconductor chip 301 in the first direction D1.

The first side surface 401a of the lower semiconductor chip 401 may be farther from the first side surface 100a of the substrate 100 than the first side surface 301a of the first semiconductor chip 301 in the direction parallel to the top surface of the substrate 100 (e.g., in the first direction D1). The second side surface 401b of the lower semiconductor chip 401 may be farther from the second side surface 100b of the substrate 100 than the second side surface 301b of the first semiconductor chip 301 in the direction parallel to the top surface of the substrate 100 (e.g., in the direction antiparallel to the first direction D1). The distance L2 between the second side surface 401b of the lower semiconductor chip 401 and the second side surface 301b of the first semiconductor chip 301 in the first direction D1 may range from 10 µm to 500 µm or from 30 µm to 250 µm. The second side surface 201b of the spacer 201 may face the first side surface 401a of the lower semiconductor chip 401.

When viewed in a plan view, an area of the lower semiconductor chip 401 may be smaller than the area of the first semiconductor chip 301. When viewed in a plan view, the width W3 of the lower semiconductor chip 401 in the second direction D2 may be smaller than the width W2 of the first semiconductor chip 301 in the second direction D2. For example, the width W3 of the lower semiconductor chip 401 in the second direction D2 may be 80 to 99% of the width W2 of the first semiconductor chip 301 in the second direction D2. A width W6 of the lower semiconductor chip 401 in the first direction D1 may be smaller than the width W5 of the first semiconductor chip 301 in the first direction D1. Stated alternatively, the widths W4, W6 and W5 may be respectively treated as widths: W1, W2 and W3, and widths W1, W3 and W2 may be respectively treated as lengths: L1, L2 and L3. In addition, advantageously, L1<L3, L2<L3, (W1+W2)<W3, and 0.8 (L3)≤L1≤0.99 (L3).

According to an embodiment of the inventive concept, since the side surfaces of the spacer 201 and the side surfaces of the lower semiconductor chip 401 are disposed at more inside positions than respective side surfaces of the first semiconductor chips 301, it may be possible to reduce a stress exerted on the portion of the substrate 100 which is placed near each of the side surfaces of the spacer 201 and the lower semiconductor chip 401. Since the stress exerted on the substrate is reduced, it may be possible to prevent or suppress a crack issue from occurring in internal interconnection lines in the substrate.

Except for the features related to the lower semiconductor chip 401 described hereinabove, the semiconductor package according to the present embodiment may be substantially the same as that described with reference to FIGS. 1A and 1B.

Figure 2C:
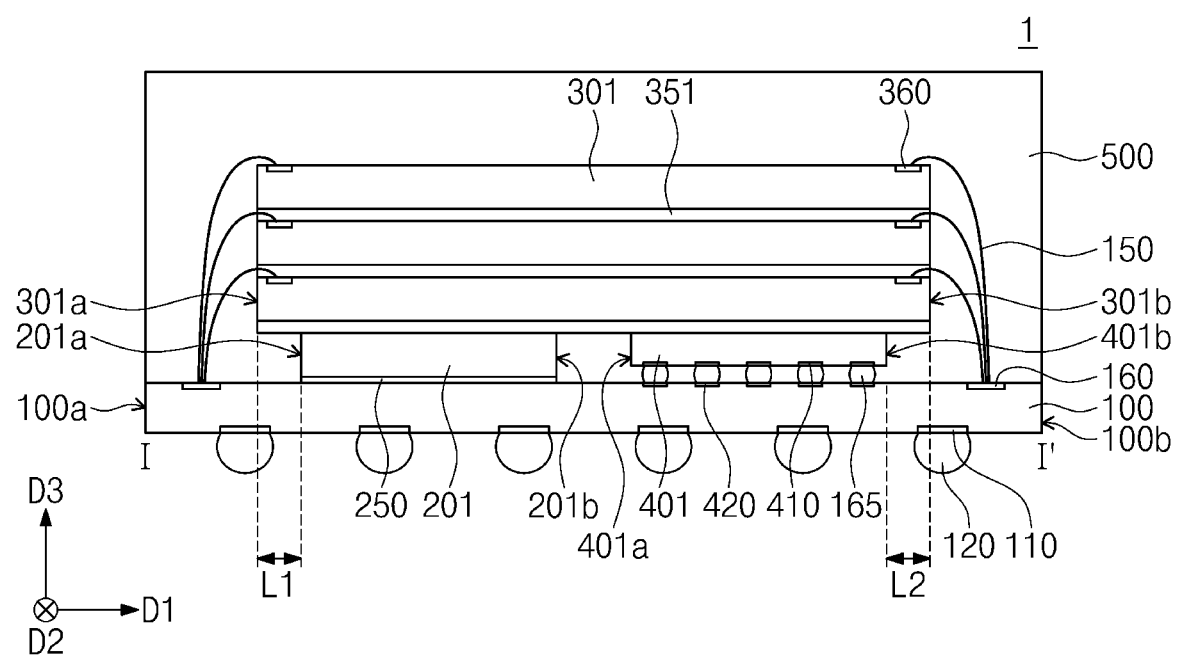
FIG. 2C is a sectional view that is taken along the line I-I' of FIG. 2A to illustrate a semiconductor package according to an embodiment of the inventive concept.

FIG. 2C is a sectional view that is taken along the line I-I' of FIG. 2A to illustrate a semiconductor package according to an embodiment of the inventive concept. For concise description, a previously described element may be identified by the same reference number without repeating an overlapping description thereof.

The lower semiconductor chip 401 may be mounted on the substrate 100 in a flip-chip bonding manner. In detail, the lower semiconductor chip 401 may include an inner terminal upper pad 410, which is disposed on a bottom surface thereof, and the inner terminal upper pad 410 of the lower semiconductor chip 401 may be electrically connected to an inner terminal lower pad 420, which is disposed on the top surface of the substrate 100, through an inner terminal 165.

In other words, the lower semiconductor chip 401 may be electrically connected to the substrate 100 through the inner terminal 165.

With the exception of the above-described features related to the inner terminal 165, the inner terminal upper pad 410, and the inner terminal lower pad 420, the semiconductor package according to the present embodiment may be substantially the same as that described with reference to FIG. 2B.

Figure 3A:
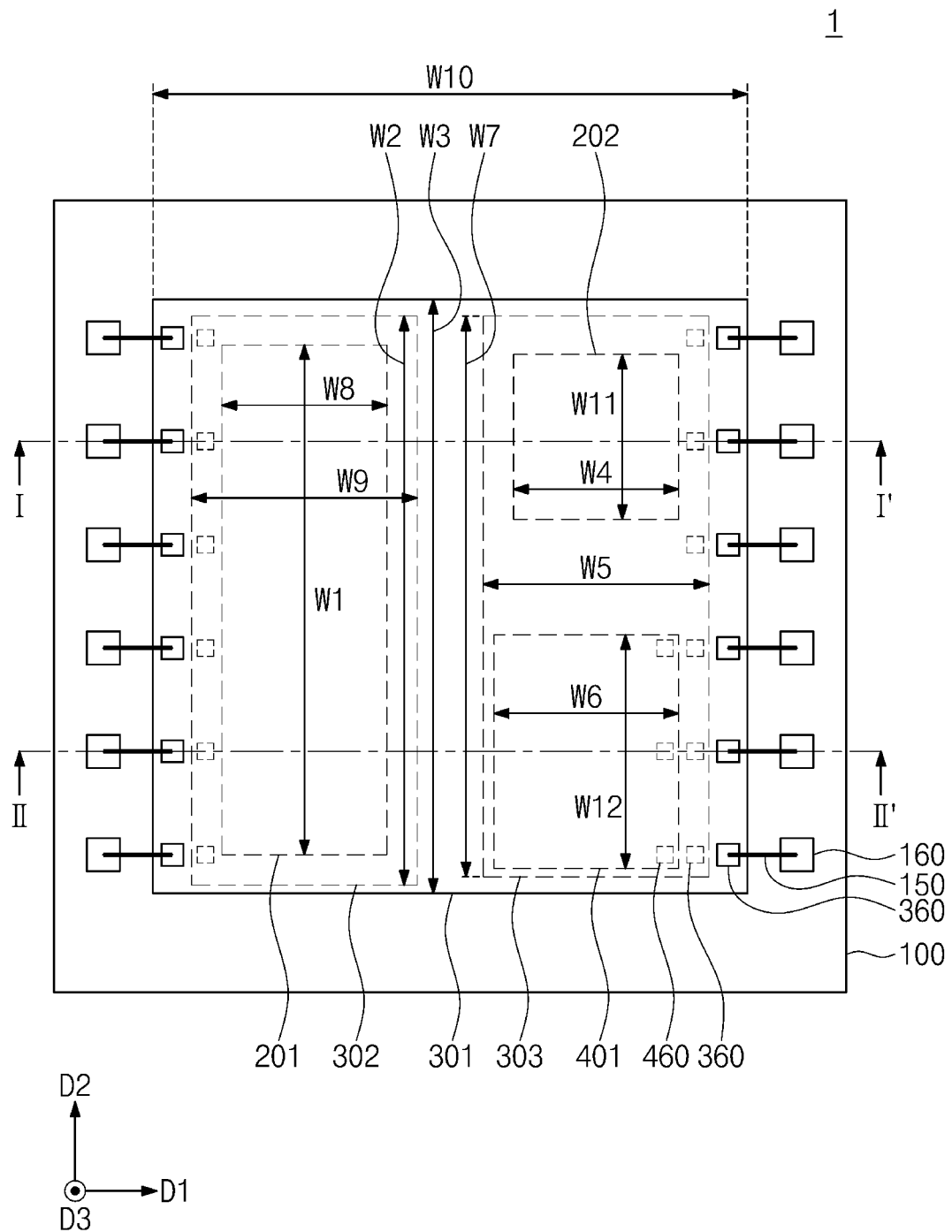
FIG. 3A is a plan view illustrating a semiconductor package according to an embodiment of the inventive concept.
Figure 3B:
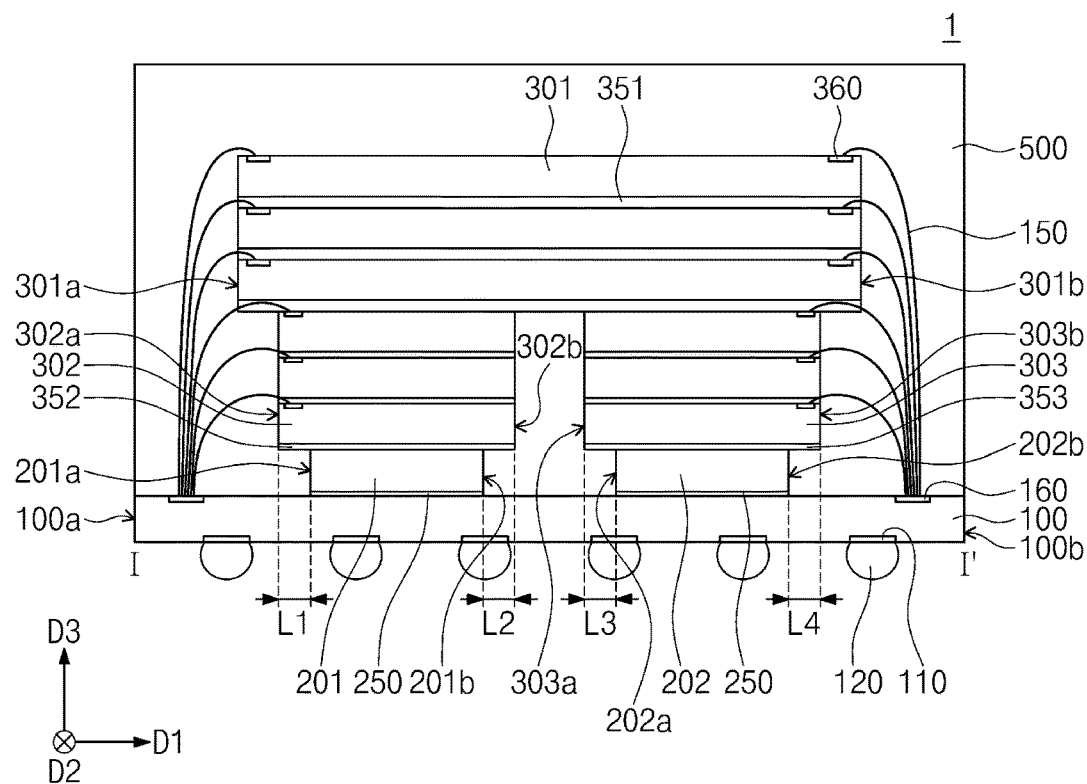
FIG. 3B is a section taken along a line I-I' of FIG. 3A.
Figure 3C:
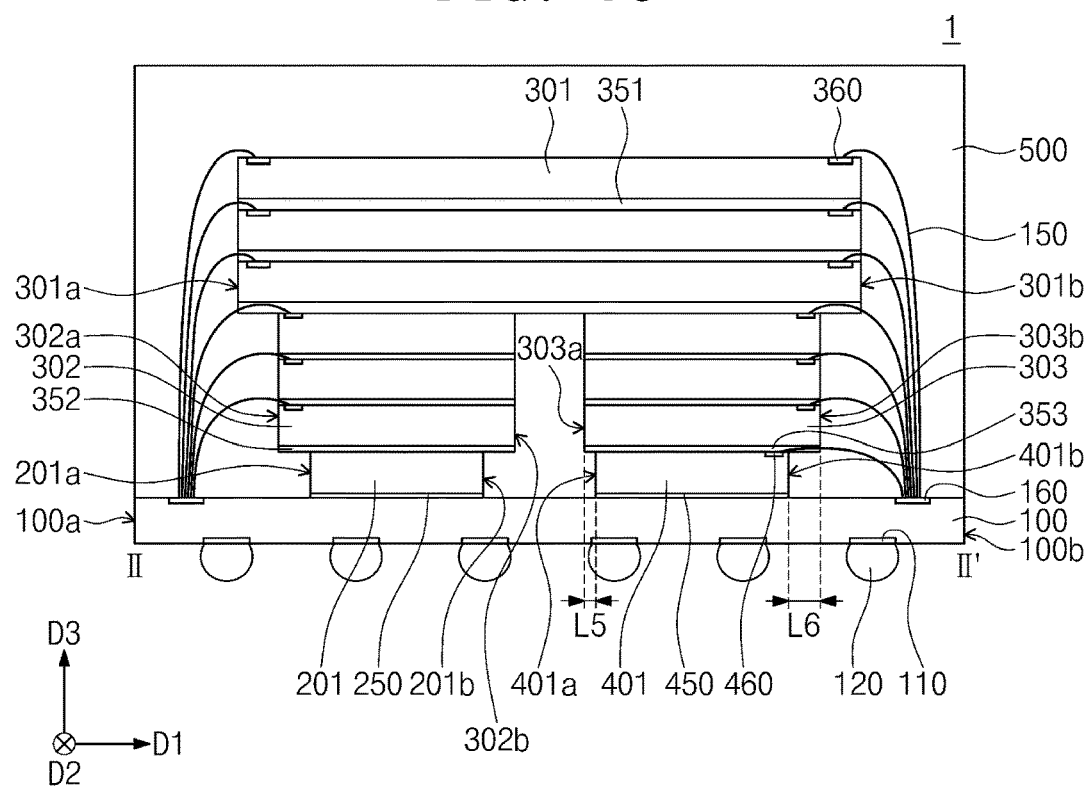
FIG. 3C is a section taken along a line II-II' of FIG. 3A.

FIG. 3A is a plan view illustrating a semiconductor package according to another embodiment of the inventive concept. FIG. 3B is a section taken along a line I-I' of FIG. 3A. FIG. 3C is a section taken along a line II-II' of FIG. 3A. For concise description, a previously described element may be identified by the same reference number without repeating an overlapping description thereof.

Referring to FIGS. 3A, 3B, and 3C, the semiconductor package 1 may include the substrate 100, a first spacer 201, a second spacer 202, the lower semiconductor chip 401, the first semiconductor chips 301, second semiconductor chips 302, third semiconductor chips 303, and the mold layer 500. The first spacer 201, the second spacer 202, and the lower semiconductor chip 401 may be provided on the substrate 100. When viewed in a plan view, the first spacer 201, the second spacer 202, and the lower semiconductor chip 401 may be arranged in a clockwise direction. The first spacer 201, the second spacer 202, and the lower semiconductor chip 401 may be horizontally spaced apart from each other. The lower semiconductor chip 401 may include the first side surface 401a, which is adjacent to the first side surface 100a of the substrate 100, and the second side surface 401b, which is opposite to the first side surface 401a.

The second semiconductor chips 302 may be provided on the first spacer 201. The third semiconductor chips 303 may be provided on the second spacer 202 and the lower semiconductor chip 401. The first semiconductor chips 301 may be provided on the uppermost one of the second semiconductor chips 302 and the uppermost one of the third semiconductor chips 303.

Referring to FIGS. 3A and 3B, the first spacer 201 and the second spacer 202 may be provided on the substrate 100. The first and second spacers 201 and 202 may support semiconductor chips, which are placed on the first and second spacers 201 and 202, respectively. The first spacer 201 and the second spacer 202 may be formed of, or include, an insulating material. For example, the first spacer 201 and the second spacer 202 may be formed of, or include, a silicon-containing insulating material. The first spacer 201 may include the first side surface 201a, which is adjacent to the first side surface 100a of the substrate 100, and the second side surface 201b, which is opposite to the first side surface 201a. The second spacer 202 may include a first side surface 202a, which is adjacent to the first side surface 100a of the substrate 100, and a second side surface 202b, which is opposite to the first side surface 202a.

The spacer adhesive layers 250 may be respectively interposed between the first spacer 201 and the substrate 100 and between the second spacer 202 and the substrate 100. The spacer adhesive layer 250 may be formed of, or include, an insulating polymer.

The second semiconductor chips 302 may be disposed between the first spacer 201 and the lowermost one of the first semiconductor chips 301. The second semiconductor chips 302 may be stacked in a vertical direction (i.e., the third direction D3). The second semiconductor chip 302 may be a memory chip. The second semiconductor chip 302 may include a first side surface 302a, which is adjacent to the first side surface 100a of the substrate 100, and a second side surface 302b, which is opposite to the first side surface 302a.

The third semiconductor chips 303 may be disposed between the second spacer 202 and the lowermost one of the first semiconductor chips 301. The third semiconductor chips 303 may be stacked in a vertical direction (i.e., the third direction D3). The third semiconductor chip 303 may be a memory chip. The lowermost one of the third semiconductor chips 303 may include a first side surface 303a, which is adjacent to the first side surface 100a of the substrate 100, and a second side surface 303b, which is opposite to the first side surface 303a. Hereinafter, the second semiconductor chip 302 may be defined as the lowermost one of the second semiconductor chips 302. The third semiconductor chip 303 may be defined as the lowermost one of the third semiconductor chips 303.

The first side surface 201a of the first spacer 201 may be farther from the first side surface 100a of the substrate 100 than the first side surface 302a of the second semiconductor chip 302 in the direction parallel to the top surface of the substrate 100 (e.g., in the first direction D1). The second side surface 201b of the first spacer 201 may be farther from the second side surface 100b of the substrate 100 than the second side surface 302b of the second semiconductor chip 302 in the direction parallel to the top surface of the substrate 100 (e.g., in the direction antiparallel to the first direction D1).

The first side surface 202a of the second spacer 202 may be farther from the first side surface 100a of the substrate 100 than the first side surface 303a of the third semiconductor chip 303 in the direction parallel to the top surface of the substrate 100 (e.g., in the first direction D1). The second side surface 202b of the second spacer 202 may be farther from the second side surface 100b of the substrate 100 than the second side surface 303b of the third semiconductor chip 303 in the direction parallel to the top surface of the substrate 100 (e.g., in the direction antiparallel to the first direction D1). The distance L1 between the first side surface 201a of the first spacer 201 and the first side surface 302a of the second semiconductor chip 302 in the first direction D1 may range from 10 μm to 500 μm or from 30 μm to 250 μm. The distance L2 between the second side surface 201b of the first spacer 201 and the second side surface 302b of the second semiconductor chip 302 in the first direction D1 may range from 10 μm to 500 μm or from 30 μm to 250 μm. A distance L3 between the first side surface 202a of the second spacer 202 and the first side surface 303a of the third semiconductor chip 303 in the first direction D1 may range from 10 μm to 500 μm or from 30 μm to 250 μm. A distance L4 between the second side surface 202b of the second spacer 202 and the second side surface 303b of the third semiconductor chip 303 in the first direction D1 may range from 10 μm to 500 μm or from 30 μm to 250 μm.

The first side surface 302a of the second semiconductor chip 302 may be farther from the first side surface 100a of the substrate 100 than the first side surface 301a of the first semiconductor chip 301 in the direction parallel to the top surface of the substrate 100 (e.g., in the first direction D1). The second side surface 303b of the third semiconductor chip 303 may be farther from the second side surface 100b of the substrate 100 than the second side surface 301b of the first semiconductor chip 301 in the direction parallel to the top surface of the substrate 100 (e.g., in the direction antiparallel to the first direction D1).

When viewed in a plan view, the area of the first spacer 201 may be smaller than an area of the second semiconductor chip 302. An area of the second spacer 202 may be smaller than an area of the third semiconductor chip 303. The areas of the second semiconductor chip 302 and the third semiconductor chip 303 may be smaller than the area of the first semiconductor chip 301.

When viewed in a plan view, the width W1 of the first spacer 201 in the second direction D2 may be smaller than the width W2 of the second semiconductor chip 302 in the second direction D2. For example, the width W1 of the first spacer 201 in the second direction D2 may be 80 to 99% of the width W2 of the second semiconductor chip 302 in the second direction D2. A width W8 of the first spacer 201 in the first direction D1 may be smaller than a width W9 of the second semiconductor chip 302 in the first direction D1.

When viewed in a plan view, the width W4 of the second spacer 202 in the first direction D1 may be smaller than the width W5 of the third semiconductor chip 303 in the first direction D1. For example, the width W4 of the second spacer 202 in the first direction D1 may be 80 to 99% of the width W5 of the third semiconductor chip 303 in the first direction D1. A width W11 of the second spacer 202 in the second direction D2 may be smaller than a width W7 of the third semiconductor chip 303 in the second direction D2.

When viewed in a plan view, the width W2 of the second semiconductor chip 302 in the second direction D2 may be smaller than the width W3 of the first semiconductor chip 301 in the second direction D2. For example, the width W2 of the second semiconductor chip 302 in the second direction D2 may be 80 to 99% of the width W3 of the first semiconductor chip 301 in the second direction D2. The width W9 of the second semiconductor chip 302 in the first direction D1 may be smaller than a width W10 of the first semiconductor chip 301 in the first direction D1.

Referring to FIGS. 3A and 3C, the lower semiconductor chip 401 may be provided on the substrate 100 to be horizontally spaced apart from the first spacer 201. The third semiconductor chips 303 may be provided on the lower semiconductor chip 401. The third semiconductor chips 303 may be disposed between the lower semiconductor chip 401 and the lowermost one of the first semiconductor chips 301.

The first side surface 401a of the lower semiconductor chip 401 may be farther from the first side surface 100a of the substrate 100 than the first side surface 303a of the third semiconductor chip 303 in the direction parallel to the top surface of the substrate 100 (e.g., in the first direction D1). The second side surface 401b of the lower semiconductor chip 401 may be farther from the second side surface 100b of the substrate 100 than the second side surface 303b of the third semiconductor chip 303 in the direction parallel to the top surface of the substrate 100 (e.g., in the direction antiparallel to the first direction D1). A distance L5 between the first side surface 401a of the lower semiconductor chip 401 and the first side surface 303a of the third semiconductor chip 303 in the first direction D1 may range from 10 μm to 500 μm or from 30 μm to 250 μm. A distance L6 between the second side surface 401b of the lower semiconductor chip 401 and the second side surface 303b of the third semiconductor chip 303 in the first direction D1 may range from 10 μm to 500 μm or from 30 μm to 250 μm.

When viewed in a plan view, the area of the lower semiconductor chip 401 may be smaller than the area of the third semiconductor chip 303. When viewed in a plan view, the width W6 of the lower semiconductor chip 401 in the first direction D1 may be smaller than the width W5 of the third semiconductor chip 303 in the first direction D1. For example, the width W6 of the lower semiconductor chip 401 in the first direction D1 may be 80 to 99% of the width W5 of the third semiconductor chip 303 in the first direction D1.

A width W12 of the lower semiconductor chip 401 in the second direction D2 may be smaller than the width W7 of the third semiconductor chip 303 in the second direction D2.

According to an embodiment of the inventive concept, since the side surfaces of the first spacer 201 are disposed at more inside positions than the side surfaces of the second semiconductor chips 302 and the side surfaces of the second spacer 202 and the lower semiconductor chip 401 are disposed at more inside positions than the side surfaces of the third semiconductor chips 303, it may be possible to reduce a stress exerted on the portion of the substrate 100 which is placed near each of the side surfaces of the first spacer 201, the second spacer 202, and the lower semiconductor chip 401. Since the stress exerted on the substrate is reduced, it may be possible to prevent or suppress a crack issue from occurring in internal interconnection lines in the substrate.

Referring back to FIGS. 3A, 3B, and 3C, the chip pads 360 may be provided on the top surface of each of the second semiconductor chips 302 and the top surface of each of the third semiconductor chips 303. The second semiconductor chips 302 and the third semiconductor chips 303 may be electrically connected to the substrate pads 160 through the connecting portions 150. Thus, the second semiconductor chips 302 and the third semiconductor chips 303 may be electrically connected to the substrate 100.

Second semiconductor chip adhesive layers 352 may be respectively interposed between the second semiconductor chips 302 and between the lowermost one of the second semiconductor chips 302 and the first spacer 201. Third semiconductor chip adhesive layers 353 may be respectively interposed between the third semiconductor chips 303 and between the lowermost one of the third semiconductor chips 303 and the first spacer 201.

The mold layer 500 may be provided on the substrate 100 to cover the first spacer 201, the second spacer 202, the lower semiconductor chip 401, the first semiconductor chips 301, the second semiconductor chips 302, and the third semiconductor chips 303.

Figure 4:
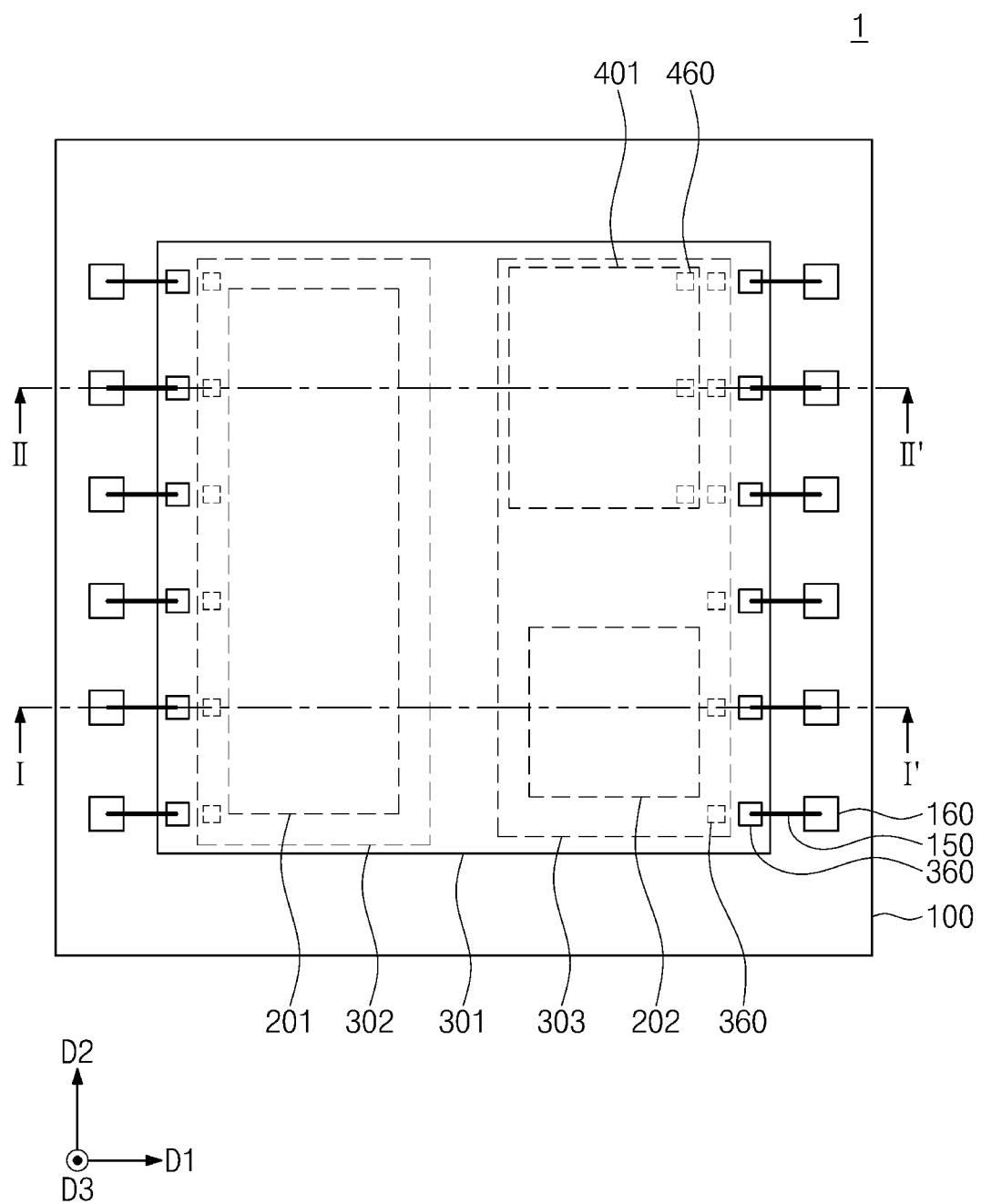
FIG. 4 is a plan view illustrating a semiconductor package according to an embodiment of the inventive concept.

FIG. 4 is a plan view illustrating a semiconductor package according to an embodiment of the inventive concept. FIG. 3B is a sectional view taken along a line I-I' of FIG. 4. FIG. 3C is a sectional view taken along a line II-II' of FIG. 4. For concise description, a previously described element may be identified by the same reference number without repeating an overlapping description thereof.

The semiconductor package 1 may include the substrate 100, the first spacer 201, the second spacer 202, the lower semiconductor chip 401, the first semiconductor chips 301, the second semiconductor chips 302, the third semiconductor chips 303, and the mold layer 500.

The first spacer 201, the lower semiconductor chip 401, and the second spacer 202 may be provided on the substrate 100. When viewed in a plan view, the first spacer 201, the lower semiconductor chip 401, and the second spacer 202 may be arranged in a clockwise direction. The first spacer 201, the lower semiconductor chip 401, and the second spacer 202 may be disposed to be spaced apart from each other.

Except for the above-described features related to the arrangement of the first spacer 201, the lower semiconductor chip 401, and the second spacer 202, the semiconductor package according to the present embodiment may be substantially the same as that described with reference to FIGS. 3A, 3B, and 3C.

Figure 5A:
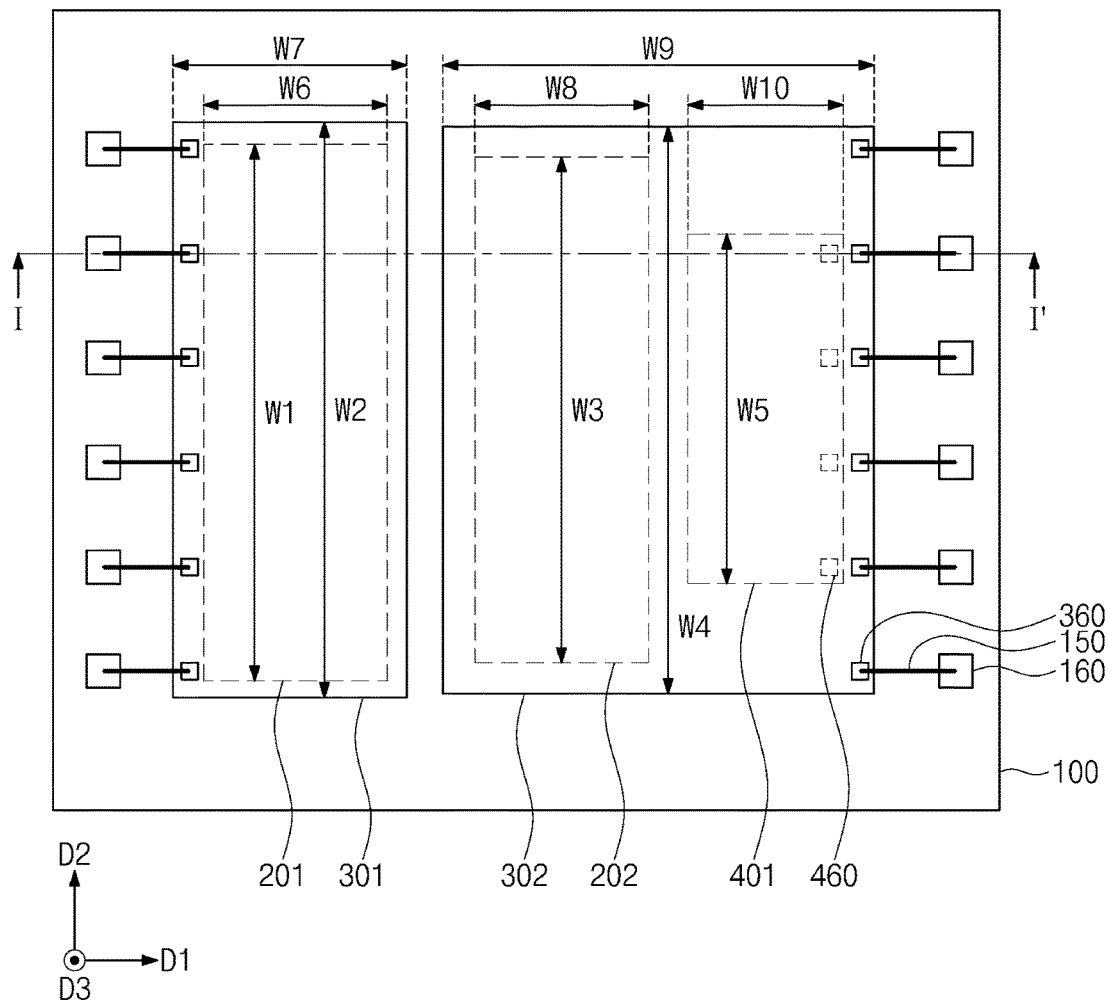
FIG. 5A is a plan view illustrating a semiconductor package according to an embodiment of the inventive concept.
Figure 5B:
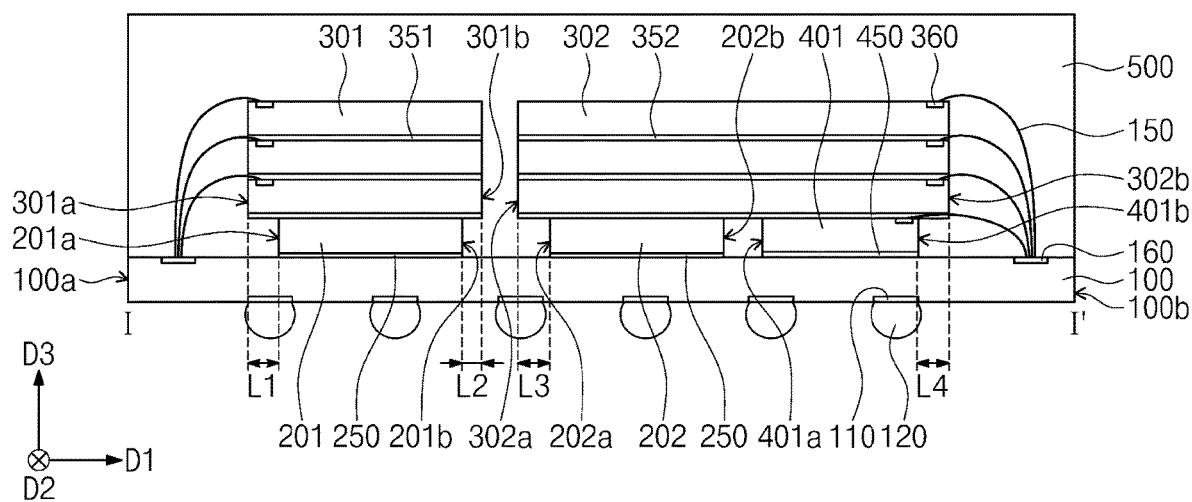
FIG. 5B is a section taken along a line I-I' of FIG. 5A.

FIG. 5A is a plan view illustrating a semiconductor package according to an embodiment of the inventive concept. FIG. 5B is a section taken along a line I-I' of FIG. 5A. For concise description, a previously described element may be identified by the same reference number without repeating an overlapping description thereof.

Referring to FIGS. 5A and 5B, the semiconductor package 1 may include the substrate 100, the first spacer 201, the second spacer 202, the lower semiconductor chip 401, the first semiconductor chips 301, the second semiconductor chips 302, and the mold layer 500. The first spacer 201, the second spacer 202, and the lower semiconductor chip 401 may be provided on the substrate 100 to be horizontally spaced apart from each other. The first spacer 201 and the lower semiconductor chip 401 may be horizontally spaced apart from each other, with the second spacer 202 interposed therebetween. The first semiconductor chips 301 may be stacked on the first spacer 201 in a vertical direction (i.e., the third direction D3). The second semiconductor chips 302 may be stacked on the second spacer 202 and the lower semiconductor chip 401 in a vertical direction (e.g., the third direction D3).

The first side surface 201a of the first spacer 201 may be farther from the first side surface 100a of the substrate 100 than the first side surface 301a of the first semiconductor chip 301 in the direction parallel to the top surface of the substrate 100 (e.g., in the first direction D1). The second side surface 201b of the first spacer 201 may be farther from the second side surface 100b of the substrate 100 than the second side surface 301b of the first semiconductor chip 301 in the direction parallel to the top surface of the substrate 100 (e.g., in the direction antiparallel to the first direction D1). The distance L1 between the first side surface 201a of the first spacer 201 and the first side surface 301a of the first semiconductor chip 301 in the first direction D1 may range from 10 μm to 500 μm or from 30 μm to 250 μm. The distance L2 between the second side surface 201b of the first spacer 201 and the second side surface 301b of the first semiconductor chip 301 in the first direction D1 may range from 10 μm to 500 μm or from 30 μm to 250 μm.

When viewed in a plan view, the area of the first spacer 201 may be smaller than the area of the first semiconductor chip 301. When viewed in a plan view, the width W1 of the first spacer 201 in the second direction D2 may be smaller than the width W2 of the first semiconductor chip 301 in the second direction D2. For example, the width W1 of the first spacer 201 in the second direction D2 may be 80 to 99% of the width W2 of the first semiconductor chip 301 in the second direction D2. The width W6 of the first spacer 201 in the first direction D1 may be smaller than the width W7 of the first semiconductor chip 301 in the first direction D1.

The first side surface 202a of the second spacer 202 may be farther from the first side surface 100a of the substrate 100 than the first side surface 302a of the second semiconductor chip 302 in the direction parallel to the top surface of the substrate 100 (e.g., in the first direction D1). The second side surface 202b of the second spacer 202 may be farther from the second side surface 100b of the substrate 100 than the second side surface 302b of the second semiconductor chip 302 in the direction parallel to the top surface of the substrate 100 (e.g., in the direction antiparallel to the first direction D1). The distance L3 between the first side surface 202a of the second spacer 202 and the first side surface 302a of the second semiconductor chip 302 in the first direction D1 may range from 10 μm to 500 μm or from 30 μm to 250 μm.

The first side surface 401a of the lower semiconductor chip 401 may face the second side surface 202b of the second spacer 202. The second side surface 401b of the lower semiconductor chip 401 may be farther from the second side surface 100b of the substrate 100 than the second side surface 302b of the second semiconductor chip 302 in the direction parallel to the top surface of the substrate 100 (e.g., in the direction antiparallel to the first direction D1). The distance L4 between the second side surface 401b of the lower semiconductor chip 401 and the second side surface 302b of the second semiconductor chip 302 in the first direction D1 may range from 10 µm to 500 µm or from 30 µm to 250 µm.

When viewed in a plan view, the area of the second spacer 202 may be smaller than the area of the second semiconductor chip 302. When viewed in a plan view, the width W3 of the second spacer 202 in the second direction D2 may be smaller than the width W4 of the second semiconductor chip 302 in the second direction D2. For example, the width W3 of the second spacer 202 in the second direction D2 may be 80 to 99% of the width W4 of the second semiconductor chip 302 in the second direction D2. The width W8 of the second spacer 202 in the first direction D1 may be smaller than the width W9 of the second semiconductor chip 302 in the first direction D1.

When viewed in a plan view, the area of the lower semiconductor chip 401 may be smaller than the area of the second semiconductor chip 302. When viewed in a plan view, the width W5 of the lower semiconductor chip 401 in the second direction D2 may be smaller than the width W4 of the second semiconductor chip 302 in the second direction D2. For example, the width W5 of the lower semiconductor chip 401 in the second direction D2 may be 80 to 99% of the width W4 of the second semiconductor chip 302 in the second direction D2. The width W10 of the lower semiconductor chip 401 in the first direction D1 may be smaller than the width W9 of the second semiconductor chip 302 in the first direction D1.

According to an embodiment of the inventive concept, since the side surfaces of the first spacer 201 are disposed at more inside positions than the side surfaces of the first semiconductor chips 301 and the side surfaces of the second spacer 202 and the lower semiconductor chip 401 are disposed at more inside positions than the side surfaces of the second semiconductor chips 302, it may be possible to reduce a stress exerted on the portion of the substrate 100 which is placed near each of the side surfaces of the first spacer 201, the second spacer 202, and the lower semiconductor chip 401. Since the stress exerted on the substrate is reduced, it may be possible to prevent or suppress a crack issue from occurring in internal interconnection lines in the substrate.

Figure 6A:
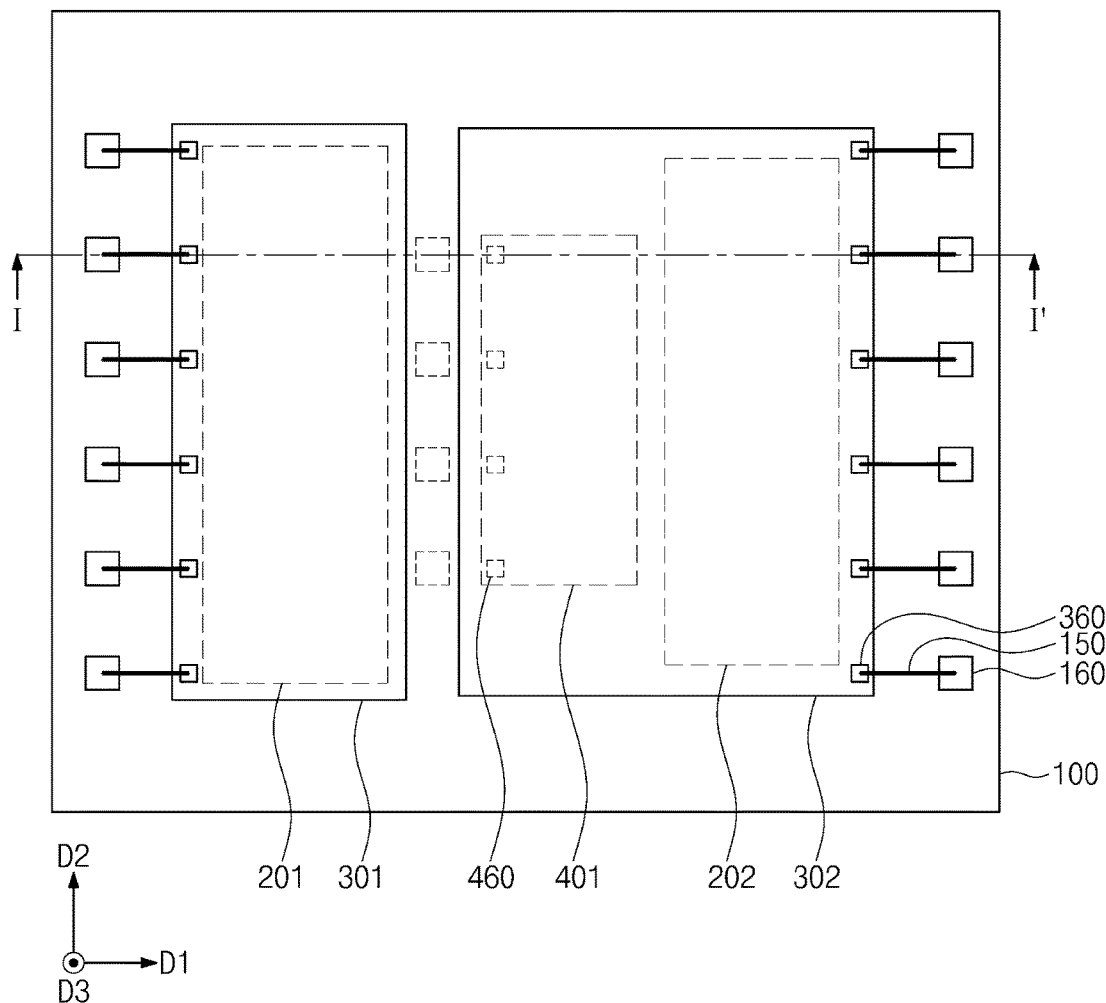
FIG. 6A is a plan view illustrating a semiconductor package according to an embodiment of the inventive concept.
Figure 6B:
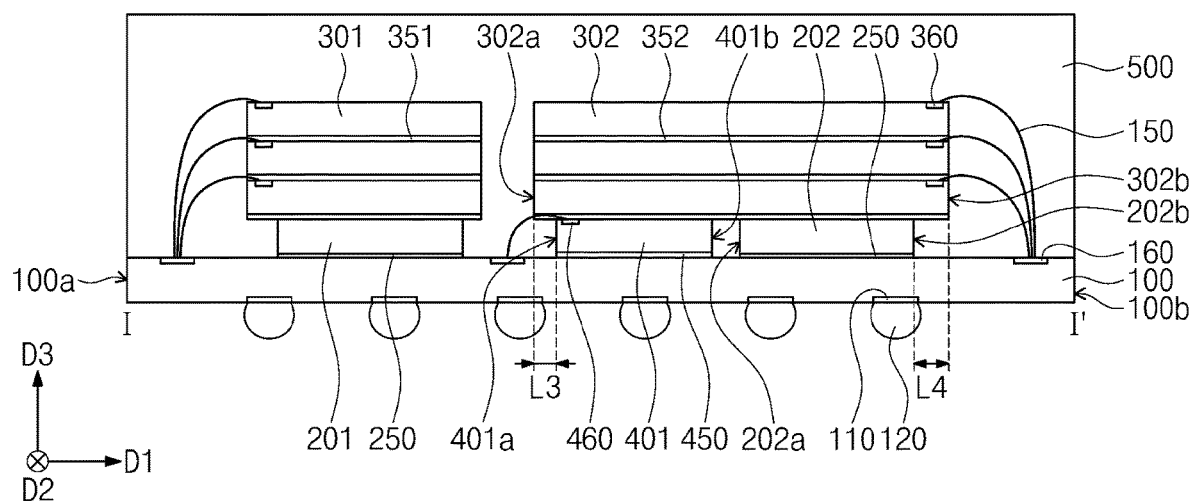
FIG. 6B is a section taken along a line I-I' of FIG. 6A.

FIG. 6A is a plan view illustrating a semiconductor package according to an embodiment of the inventive concept. FIG. 6B is a section taken along a line I-I' of FIG. 6A. For concise description, a previously described element may be identified by the same reference number without repeating an overlapping description thereof. Referring to FIGS. 6A and 6B, the first spacer 201 and the second spacer 202 may be horizontally spaced apart from each other, with the lower semiconductor chip 401 interposed therebetween.

The first side surface 401a of the lower semiconductor chip 401 may be farther from the first side surface 100a of the substrate 100 than the first side surface 302a of the second semiconductor chips 302 in the direction parallel to the top surface of the substrate 100 (e.g., in the first direction D1). The second side surface 401b of the lower semiconductor chip 401 may be farther from the second side surface 100b of the substrate 100 than the second side surface 302b of the second semiconductor chips 302 in the direction parallel to the top surface of the substrate 100 (e.g., in the direction antiparallel to the first direction D1). The distance L3 between the first side surface 401a of the lower semiconductor chip 401 and the first side surface 302a of the second semiconductor chips 302 in the first direction D1 may range from 10 µm to 500 µm or from 30 µm to 250 µm.

The first side surface 202a of the second spacer 202 may face the second side surface 401b of the lower semiconductor chip 401. The second side surface 202b of the second spacer 202 may be farther from the second side surface 100b of the substrate 100 than the second side surface 302b of the second semiconductor chip 302 in the direction parallel to the top surface of the substrate 100 (e.g., in the direction antiparallel to the first direction D1). The distance L4 between the second side surface 202b of the second spacer 202 and the second side surface 302b of the second semiconductor chip 302 in the first direction D1 may range from 10 µm to 500 µm or from 30 µm to 250 µm. Except for the above-described features related to the arrangement of the first spacer 201, the lower semiconductor chip 401, and the second spacer 202, the semiconductor package according to the present embodiment may be substantially the same as that described with reference to FIGS. 5A and 5B.

Figure 7A:
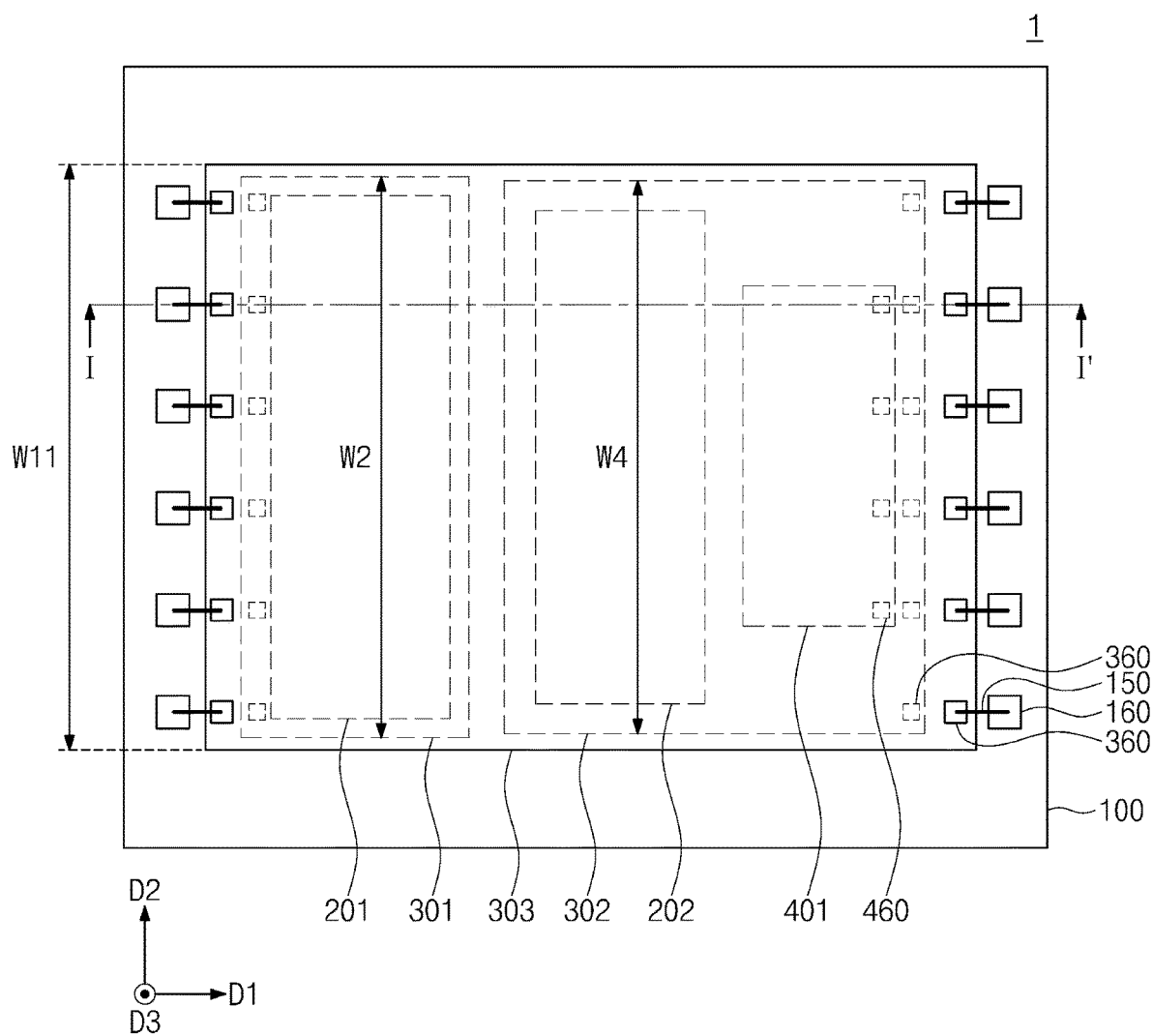
FIG. 7A is a plan view illustrating a semiconductor package according to an embodiment of the inventive concept.
Figure 7B:
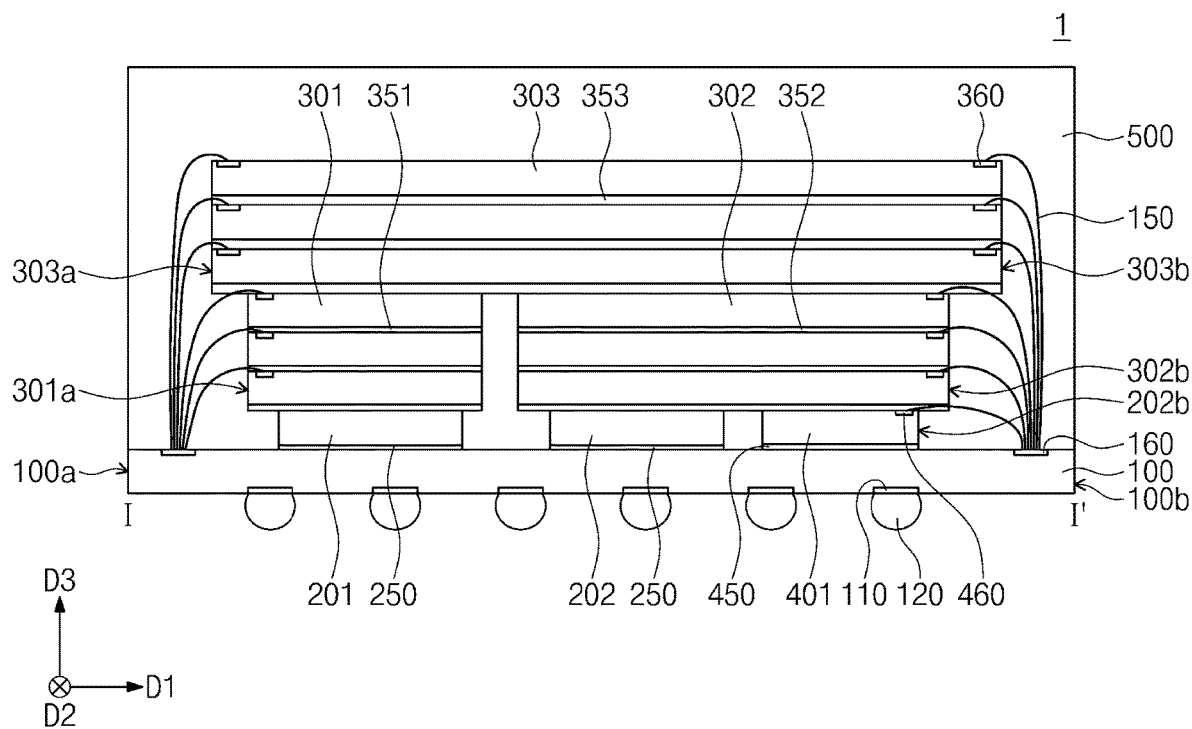
FIG. 7B is a section taken along a line I-I' of FIG. 7A.

FIG. 7A is a plan view illustrating a semiconductor package according to an embodiment of the inventive concept. FIG. 7B is a section taken along a line I-I' of FIG. 7A. For concise description, a previously described element may be identified by the same reference number without repeating an overlapping description thereof. Referring to FIGS. 7A and 7B, a plurality of third semiconductor chips 303 may be stacked on the uppermost one of the first semiconductor chips 301 and the uppermost one of the second semiconductor chips 302 in a vertical direction (e.g., in the third direction D3).

The first side surface 301a of the first semiconductor chips 301 may be farther from the first side surface 100a of the substrate 100 than the first side surface 303a of the third semiconductor chip 303 in the direction parallel to the top surface of the substrate 100 (e.g., in the first direction D1). The second side surface 302b of the second semiconductor chip 302 may be farther from the second side surface 100b of the substrate 100 than the second side surface 303b of the third semiconductor chip 303 in the direction parallel to the top surface of the substrate 100 (e.g., in the direction antiparallel to the first direction D1).

When viewed in a plan view, the area of the first semiconductor chip 301 may be smaller than the area of the third semiconductor chip 303. The area of the second semiconductor chip 302 may be smaller than the area of the third semiconductor chip 303. When viewed in a plan view, the width W2 of the first semiconductor chip 301 in the second direction D2 may be smaller than the width W11 of the third semiconductor chip 303 in the second direction D2. The width W4 of the second semiconductor chip 302 in the second direction D2 may be smaller than the width W11 of the third semiconductor chip 303 in the second direction D2.

Except for the above-described features related to the first semiconductor chips 301, the semiconductor package according to the present embodiment may be substantially the same as that described with reference to FIGS. 5A and 5B.

Figure 8A:
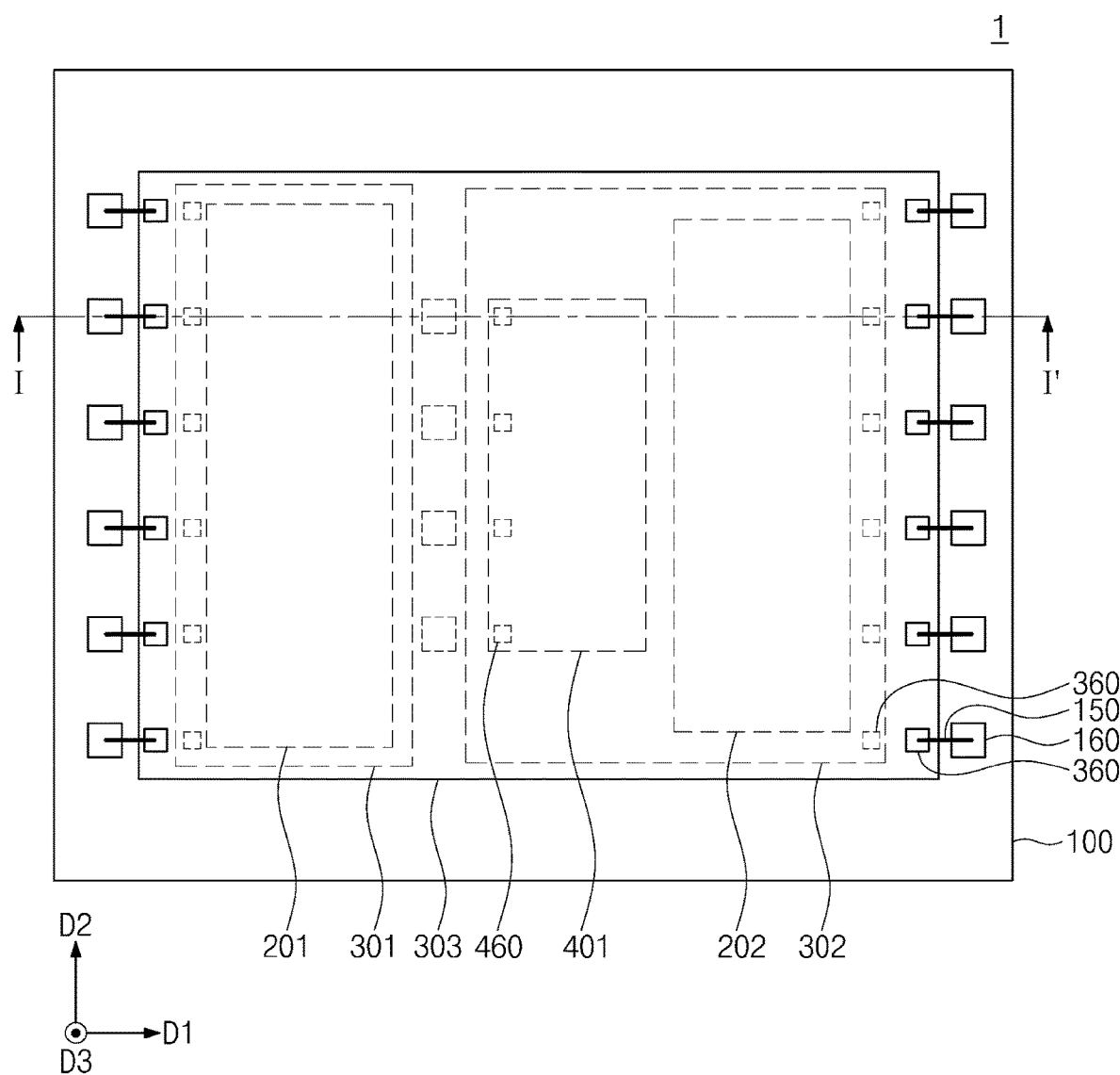
FIG. 8A is a plan view illustrating a semiconductor package according to an embodiment of the inventive concept.
Figure 8B:
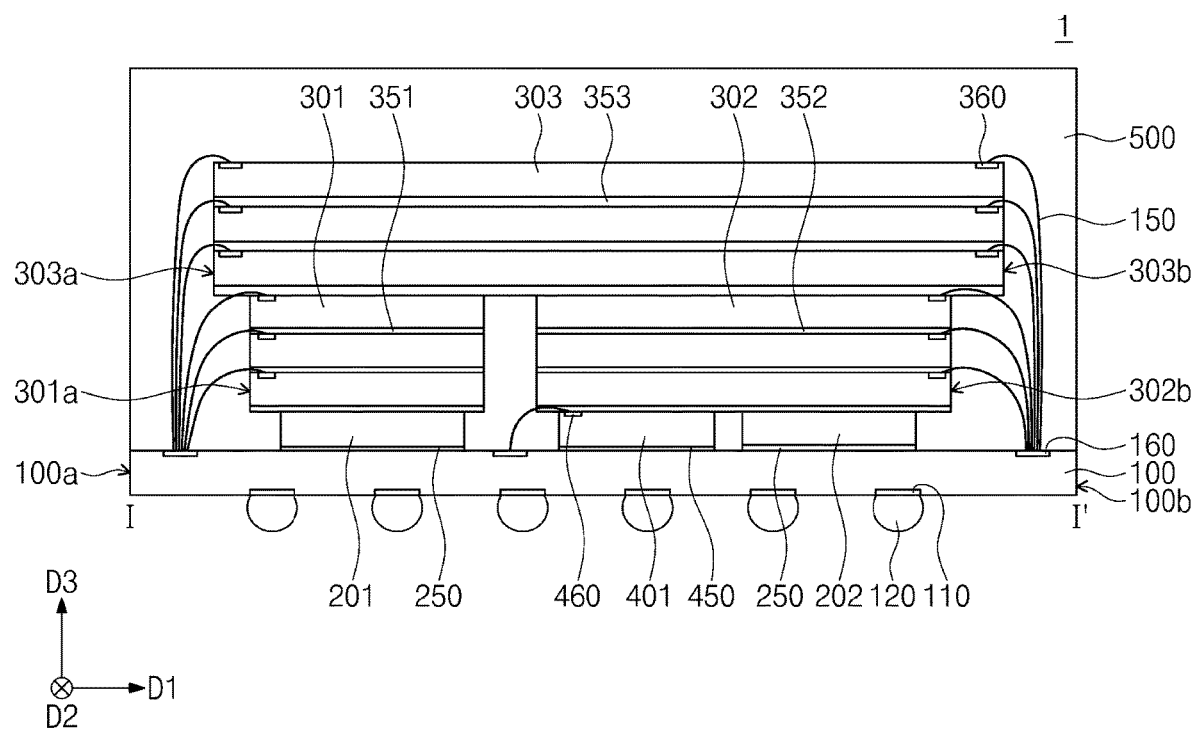
FIG. 8B is a section taken along a line I-I' of FIG. 8A.

FIG. 8A is a plan view illustrating a semiconductor package according to an embodiment of the inventive concept. FIG. 8B is a section taken along a line I-I' of FIG. 8A. For concise description, a previously described element may be identified by the same reference number without repeating an overlapping description thereof.

Referring to FIGS. 8A and 8B, the third semiconductor chips 303 may be stacked on the uppermost one of the first semiconductor chips 301 and the uppermost one of the second semiconductor chips 302 in a vertical direction (e.g., in the third direction D3). The first side surface 301a of the first semiconductor chips 301 may be farther from the first side surface 100a of the substrate 100 than the first side surface 303a of the third semiconductor chip 303 in the direction parallel to the top surface of the substrate 100 (e.g., in the first direction D1). The second side surface 302b of the second semiconductor chip 302 may be farther from the second side surface 100b of the substrate 100 than the second side surface 303b of the third semiconductor chip 303 in the direction parallel to the top surface of the substrate 100 (e.g., in the direction antiparallel to the first direction D1).

When viewed in a plan view, the area of the first semiconductor chip 301 may be smaller than the area of the third semiconductor chip 303. The area of the second semiconductor chip 302 may be smaller than the area of the third semiconductor chip 303. When viewed in a plan view, the width W2 of the first semiconductor chip 301 in the second direction D2 may be smaller than the width W11 of the third semiconductor chip 303 in the second direction D2. The width W4 of the second semiconductor chip 302 in the second direction D2 may be smaller than the width W11 of the third semiconductor chip 303 in the second direction D2.

Except for the above-described features related to the third semiconductor chips 303, the semiconductor package according to the present embodiment may be substantially the same as that described with reference to FIGS. 6A and 6B.

Figure 9:
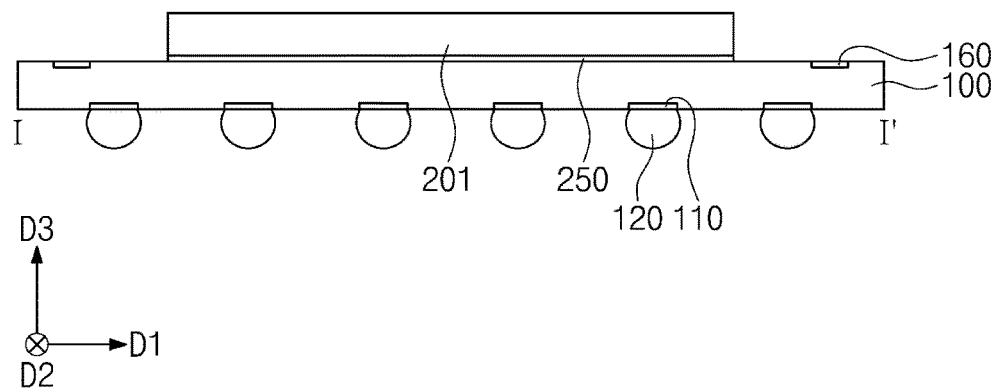
FIGS. 9 and 10 are sectional views illustrating a method of fabricating a semiconductor package, according to an embodiment of the inventive concept.
Figure 10:
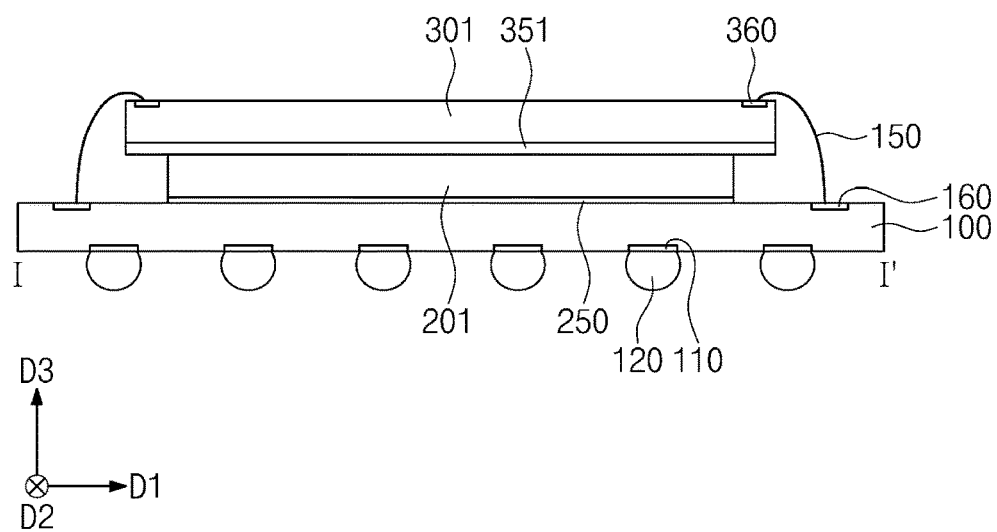

FIGS. 1B, 9, and 10 are sectional views illustrating a method of fabricating a semiconductor package, according to an embodiment of the inventive concept. Referring to FIG. 9, the substrate 100 may be provided. The terminal pads 110 and the outer terminals 120 may be provided on the bottom surface of the substrate 100. The substrate pads 160 may be provided on the top surface of the substrate 100. The spacer 201 may be formed on the substrate 100. The spacer 201 may be attached to the substrate 100 by the spacer adhesive layer 250, which is formed on a bottom surface of the spacer 201.

Referring to FIG. 10, the first semiconductor chip 301 may be formed on the spacer 201. The first semiconductor chip 301 may be attached to the spacer 201 by the first semiconductor chip adhesive layer 351, which is formed on a bottom surface of the first semiconductor chip 301. The connecting portions 150 may be formed to electrically connect the chip pads 360, which are formed on the top surface of the first semiconductor chip 301, to the substrate pads 160.

Referring back to FIG. 1B, the first semiconductor chips 301 may be stacked on the first semiconductor chip 301 in a vertical direction (e.g., in the third direction D3). In detail, the first semiconductor chips 301 may be formed by the same method as that described with reference to FIG. 9. The connecting portions 150 may be formed to electrically connect the chip pads 360, which are respectively from on the top surfaces of the first semiconductor chips 301, to the substrate pads 160. The mold layer 500 may be formed to cover the first spacer 201 and the first semiconductor chips 301.

In a semiconductor package according to an embodiment of the inventive concept, side surfaces of a spacer on a substrate may be disposed at more inside positions than side surfaces of semiconductor chips on the spacer, and thus, it may be possible to reduce a stress exerted on a portion of the substrate which is placed near each of the side surfaces of the spacer. Since the stress exerted on the substrate is reduced, it may be possible to prevent or suppress a crack issue from occurring in internal interconnection lines in the substrate.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor package comprising:
   a substrate having a first side surface and a second side surface, which are opposite to each other;
   a spacer on the substrate and insulated from the substrate;
   a first semiconductor chip on the substrate to be horizontally spaced apart from the spacer and electrically connected to the substrate; and
   a plurality of second semiconductor chips stacked in alignment on the spacer and the first semiconductor chip, such that all sidewalls of each of the plurality of second semiconductor chips are vertically aligned to corresponding sidewalls of the other second semiconductor chips;
   wherein the spacer has an outer side surface, which is adjacent to the first side surface of the substrate, and an inner side surface, which is opposite to the outer side surface of the spacer;
   wherein the first semiconductor chip has an outer side surface, which his adjacent to the second side surface of the substrate, and an inner side surface, which is opposite to the outer side surface of the first semiconductor chip;
   wherein each of the plurality of second semiconductor chips has a third side surface, which is adjacent to the first side surface of the substrate, and a fourth side surface, which is opposite to the third side surface;
   wherein the outer side surface of the spacer is farther from the first side surface of the substrate than the third side surface of the lowermost second semiconductor chips in a first direction parallel to a top surface of the substrate;
   wherein the outer side surface of the first semiconductor chip is farther from the second side surface of the substrate than the fourth side surface of the lowermost second semiconductor chips in a direction antiparallel to the first direction; and
   wherein a distance between the outer side surface of the spacer and the third side surface of the lowermost second semiconductor chip in the first direction is the same as the distance between the outer side surface of the first semiconductor chip and the fourth side surface of the lowermost second semiconductor chips in the first direction.

2. The semiconductor package of claim 1,
   wherein the inner side surface of the first semiconductor chip faces the inner side surface of the spacer.

3. The semiconductor package of claim 1, wherein the distance between the outer side surface of the spacer and the third side surface of the lowermost second semiconductor chip in the first direction ranges from 10 μm to 500 μm.

4. The semiconductor package of claim 1, wherein, when viewed in a plan view, an area of the spacer is smaller than an area of the lowermost second semiconductor chip, and an area of the first semiconductor chip is smaller than the area of the lowermost second semiconductor chip.

5. The semiconductor package of claim 1, wherein, when viewed in a plan view, the spacer has a width in a second direction that is parallel to the substrate and is perpendicular to the first direction; and wherein the width of the spacer in the second direction is smaller than a width of the lowermost second semiconductor chip in the second direction.

6. The semiconductor package of claim 1, wherein the spacer comprises an insulating material.

7. The semiconductor package of claim 1, further comprising adhesive layers interposed between the spacer and the substrate, between the first semiconductor chip and the substrate, between the lowermost second semiconductor chip and each of the spacer and the first semiconductor chip, and between the second semiconductor chips.

8. The semiconductor package of claim 1, further comprising:
a mold layer provided on the substrate to cover the spacer, the first semiconductor chip, and the second semiconductor chips; and
bonding wires electrically connecting each of the first and second semiconductor chips to the substrate.

9. A packaged integrated circuit device, comprising:
a substrate having a surface thereon;
a spacer insulated from the substrate and a first semiconductor chip electrically connected to the substrate at spaced-apart locations on a first portion of the surface of the substrate, said first portion of the surface of the substrate having a lateral area equivalent to a sum of: (i) a lateral footprint of the spacer, (ii) a lateral footprint of the first semiconductor chip, and (iii) an area of an entire lateral space between the spacer and the first semiconductor chip; and
a stack of second semiconductor chips in alignment and extending on the spacer and on the first semiconductor chip, said stack of second semiconductor chips having a lateral footprint greater than the lateral area of the first portion of the surface of the substrate so that at least a portion of the stack of second semiconductor chips overhangs at least one sidewall of at least one of the spacer and the first semiconductor chip, which extend between the stack of second semiconductor chips and the surface of the substrate;
wherein the spacer is a rectangular-shaped spacer having a first thickness, as measured in a direction normal to the surface of the substrate, a first width (W1), as measured in a first direction that is parallel to the surface of the substrate, and a first length (L1), as measured in a second direction that is parallel to the surface of the substrate and orthogonal to the first direction;
wherein the first semiconductor chip is a rectangular-shaped chip having a second thickness, as measured in the direction normal to the surface of the substrate, a second width (W2), as measured in the first direction parallel to the surface of the substrate, and a second length (L2), as measured in the second direction parallel to the surface of the substrate;
wherein a first one of the stack of second semiconductor chips closest to the surface of the substrate has a third width (W3), as measured in the first direction parallel to the surface of the substrate, and a third length (L3), as measured in the second direction parallel to the surface of the substrate;
wherein L1<L3, L2<L3, and (W1+W2)<W3;
wherein the first one of the stack of second semiconductor chips closest to the surface of the substrate has a first side surface and a second side surface, which are opposite to each other in the first direction;
wherein an outer side surface of the spacer is adjacent to the first side surface;
wherein an outer side surface of the first semiconductor is adjacent to the second side surface; and
wherein a distance between the outer surface of the spacer and the first side surface in the first direction is the same as a distance between the outer surface of the first semiconductor and the second side surface in the first direction.

10. The device of claim 9, wherein an overhang between the portion of the stack of second semiconductor chips and the at least one sidewall is in a range from 10 μm to 500 μm.

11. The device of claim 9, wherein $0.8(L3) \leq L1 \leq 0.99(L3)$.

12. The device of claim 9, wherein the spacer comprises an electrically insulating material.

13. The device of claim 9, further comprising:
a first adhesive layer adhering the spacer to the surface of the substrate;
a second adhesive layer adhering the first semiconductor chip to the surface of the substrate; and
a third adhesive layer adhering a first one of the stack of second semiconductor chips to at least one of the spacer and the first semiconductor chip.

* * * * *